(12) United States Patent
Koyanagi et al.

(10) Patent No.: US 7,741,173 B2
(45) Date of Patent: Jun. 22, 2010

(54) METHOD FOR FORMING A METAL OXIDE FILM

(75) Inventors: Kenichi Koyanagi, Tokyo (JP); Hiroshi Sakuma, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 303 days.

(21) Appl. No.: 11/746,185

(22) Filed: May 9, 2007

(65) Prior Publication Data

US 2007/0205452 A1    Sep. 6, 2007

Related U.S. Application Data

(63) Continuation of application No. 10/808,193, filed on Mar. 24, 2004, now Pat. No. 7,256,144.

(30) Foreign Application Priority Data

Mar. 27, 2003   (JP)   ............................. 2003-087577

(51) Int. Cl.
   *H01L 21/8242*   (2006.01)
(52) U.S. Cl. ................ 438/240; 438/628; 257/E21.008
(58) Field of Classification Search .................. 438/240, 438/628, 778
   See application file for complete search history.

(56) References Cited

U.S. PATENT DOCUMENTS

| | | | |
|---|---|---|---|
| 6,458,416 B1 | 10/2002 | Derderian et al. | |
| 6,592,942 B1 | 7/2003 | Van Wijck | |
| 6,767,582 B1 | 7/2004 | Elers | |
| 6,858,547 B2 | 2/2005 | Metzner et al. | |
| 6,908,639 B2 | 6/2005 | Basceri et al. | |
| 2001/0024387 A1 | 9/2001 | Raaijmakers et al. | |
| 2002/0090829 A1 | 7/2002 | Sandhu et al. | |
| 2002/0115252 A1* | 8/2002 | Haukka et al. | .............. 438/240 |
| 2002/0142588 A1 | 10/2002 | Basceri et al. | |
| 2003/0129826 A1 | 7/2003 | Werkhoven et al. | |
| 2003/0207593 A1* | 11/2003 | Derderian et al. | ........... 438/778 |
| 2004/0043557 A1 | 3/2004 | Haukka et al. | |
| 2004/0200414 A1 | 10/2004 | Solanki et al. | |
| 2004/0256664 A1 | 12/2004 | Chou et al. | |
| 2005/0009335 A1 | 1/2005 | Dean et al. | |
| 2005/0012975 A1 | 1/2005 | George et al. | |
| 2006/0228888 A1 | 10/2006 | Lee et al. | |

FOREIGN PATENT DOCUMENTS

| | | |
|---|---|---|
| EP | 1 205 574 | 5/2002 |
| JP | 2002-164348 | 6/2002 |

OTHER PUBLICATIONS

Chinese Office Action, dated Mar. 9, 2007 for corresponding Chinese Patent Application 200400313924.

* cited by examiner

*Primary Examiner*—Phat X Cao
*Assistant Examiner*—Nga Doan
(74) *Attorney, Agent, or Firm*—Katten Muchin Rosenman LLP

(57) ABSTRACT

A method for forming a capacitor insulation film includes the step of depositing a monoatomic film made of a metal by supplying a metal source including the metal and no oxygen, and depositing a metal oxide film including the metal by using a CVD technique. The method provides the metal oxide film having higher film properties with a higher throughput.

18 Claims, 6 Drawing Sheets

METHOD FOR FORMING A METAL OXIDE FILM

CROSS REFERENCE TO RELATED APPLICATION

This application is a Continuation of, and claims priority under 35 USC 120 from, U.S. patent application Ser. No. 10/808,193, filed on Mar. 24, 2004 now U.S. Pat. No. 7,256,144 and claims priority under 35 USC 119 from Japanese Patent Application Number 2003-087577 filed on Mar. 27, 2003, the contents of which are herein incorporated by reference.

The present invention relates to a method for forming a metal oxide film and, more particularly, to a method for forming a metal oxide film having excellent step coverage and film qualities with a higher throughput.

In recent years, as DRAM devices have become more densely integrated, the capacitors used for storing data in the respective memory cells of the DRAM have become smaller. Silicon nitride film is generally used as a capacitor insulation film for the structure of the capacitor in the DRAM. The structure of the capacitor has become more complicated and the effective area of the capacitor insulation film has increased in order to obtain a sufficient capacitance. However, there is a tradeoff between smaller size and greater effective area in the capacitor. Moreover, as long as silicon nitride film is used as the capacitor insulation film, there cannot be significant increase in the capacitance of the capacitor.

Therefore, high dielectric materials have been sought for use as the capacitor insulation film in the DRAMs. In particular, tantalum oxide is expected to achieve a higher capacitance, and it is researched widely. This is because silicon nitride only has a dielectric constant of about 7, whereas tantalum oxide has a dielectric constant of 25 or greater. Thus, tantalum oxide film can be expected to offer an increase of threefold or greater in the capacitance of the resultant capacitor.

Until now, a CVD technique has been used to form the capacitor insulation film. When the CVD technique is used, the substrate on which the capacitor insulation film is to be grown is placed inside a reaction chamber, and the substrate temperature is maintained at a specific value. Metallic compound gas and $O_2$ gas are simultaneously supplied into the chamber, thereby inducing reactions on the substrate to grow thereon the capacitor insulation film. For example, when forming a capacitor insulation film made of tantalum oxide film, $Ta(OC_2H_5)_5$ gas and $O_2$ gas are simultaneously supplied as the metal sources. Thus, the CVD technique enables simple and quick film deposition to form the capacitor insulation film.

However, when the CVD technique is used, there is a problem in that the film thickness becomes less uniform when the surface structure of the underlying film is complicated. For example, when forming a capacitor, the capacitor insulation film is generally formed onto an underlying film having a complicated step structure. This complicated step structure is designed to increase the effective area of the capacitor insulation film to obtain a larger capacitance in the resultant capacitor. If a higher reaction rate is used when performing the CVD process on this type of the underlying film, the thickness of the capacitor insulation film becomes less uniform. The less uniformity in the film thickness is particularly observed near the step of the underlying film. In other words, step coverage of the capacitor insulation film will be deteriorated in such a structure. In order to solve this problem, the CVD process may be performed with a lower deposition rate. This approach increases the uniformity of the film thickness; however, it also becomes difficult to eliminate impurities in the film. Thus, the concentration of impurities increases in the film to decrease the density of the film, thereby degrading the film qualities.

Furthermore, when the capacitor insulation film is grown using the CVD method, a larger incubation time is needed if the underlying film is made of a material having properties significantly different from those of the material of the capacitor insulation film. In the deposition of the capacitor insulation film, nuclei are first formed as scattered across the underlying film, and then the capacitor insulation film is grown around the formed nuclei. As such, the thickness of the capacitor insulation film is different between the areas around the nuclei and the other areas. This makes the thickness of the capacitor insulation film become irregular, and degrades the above-mentioned step coverage qualities. A shorter incubation time, if employed, may allow a more uniform film thickness to be obtained for the capacitor insulation film; however, it restricts the materials that can be used for the underlying film.

In order to solve the above-mentioned problems, Patent Publication JP-A-2002-164348 describes a method for forming the capacitor insulation film made of tantalum oxide or other dielectric material having a high dielectric constant (high-k material). This method uses an ALD (atomic layer deposition) technique in which monoatomic layers (or monomolecular layers) are deposited one at a time to form a film having a desired thickness. FIG. 7 is a flowchart showing the process of forming a capacitor insulation film made of tantalum oxide in accordance with the method described in the patent publication.

In the patent publication, in order to form the tantalum oxide film, a silicon substrate is placed inside the reaction chamber, and the substrate temperature is set at 300° C., for example. $H_2O$ gas or other oxidizing gas is supplied into the reaction chamber to oxidize the surface of the silicon substrate (step A1). This causes an OH group to bind to the surface of the silicon substrate. When this occurs, the OH group is chemically bound with the connectors on the silicon substrate surface. Therefore, even when excessive amounts of $H_2O$ gas are supplied, only the monoatomic layer of the OH group can be formed. Thereafter, $N_2$ gas is supplied into the reaction chamber to purge the unreacted $H_2O$ gas from the reaction chamber (step A2), and then the reaction chamber is evacuated to vacuum (step A3).

Subsequently, $TaCl_5$ gas is supplied into the reaction chamber (Step A4). This step replaces the H atoms in the OH group, that is bound to the surface of the silicon substrate, with the $TaCl_4$ group in the $TaCl_5$ gas, thereby forming a single-layer $TaCl_4$ film bound with the O atoms on the surface of the silicon substrate. $N_2$ gas is then supplied into the reaction chamber to purge the unreacted $TaCl_5$ gas from the reaction chamber (step A5), and then the chamber is evacuated to vacuum (step A6).

Thereafter, $H_2O$ gas is supplied into the reaction chamber (step A7). This replaces the Cl in the $TaCl_4$ group on the surface of the silicon substrate with the OH group in the supplied $H_2O$ gas. $N_2$ gas is then supplied into the reaction chamber to purge the unreacted $H_2O$ gas from the reaction chamber (step A8), and then the chamber is evacuated to vacuum (step A9).

Step A4 and step A7 each uses a substitution reaction on the surface of the silicon substrate to grow the film. This enables a single monoatomic layer of the tantalum oxide to be grown in a cycle of steps running from step A4 to step A9. The capacitor insulation film made of tantalum oxide ($Ta_2O_5$) can thus be formed by iterating this cycle until the tantalum oxide film has a desired film thickness.

As described above, when the ALD technique is used to form the capacitor insulation film, the tantalum oxide film can be grown on the silicon substrate, one mono-molecule layer at a time. This makes it unnecessary to form the nuclei for the capacitor insulation film, differently from using the CVD technique, and thus enables the capacitor insulation film to be formed with a uniform film thickness, having excellent step coverage and film qualities.

However, when the ALD technique is used, the tantalum oxide film is formed as a single mono-molecule layer at a time, and thus only a low throughput is obtained to grow the film. If a tantalum oxide film of 5 nm, for example, is to be deposited, a single cycle of procedures from step A4 to step A9 takes as long as 1 minute, for example, and thus a total of 50 minutes is required for the tantalum oxide film as a whole, causing a low throughput.

It may be considered to reduce the time length needed for the one cycle, by reducing the time length for each step. However, if an insufficient time is allowed to supply the $TaCl_4$ gas (the metallic compound gas) at step A4, for example, the mono-atomic $TaCl_4$ layer cannot be formed uniformly. This causes the resultant tantalum oxide layer to have irregularities in the film thickness and film qualities. In addition, the film density is reduced to deteriorate the electrical properties of the resultant film. Furthermore, if an insufficient time is allowed to supply the $H_2O$ gas (the oxidizing gas) at step A7, then the impurities cannot be sufficiently eliminated from the mono-atomic $TaCl_4$ layer, and the surface thereof cannot be sufficiently oxidized. Thus, the film qualities and the electrical properties of the resultant tantalum oxide film deteriorate.

Thus, deposition of a capacitor insulation film having excellent film properties by using the ALD technique requires a long time compared to the deposition by the CVD technique which requires about two minutes for deposition of a capacitor insulation film having the same thickness. Thus, deposition of the capacitor insulation film by using the ALD technique is impractical in the mass production of the semiconductor devices.

It is also noted in the ALD technique to form the capacitor insulation film that the $TaCl_5$ gas and the $H_2O$ gas are alternatively supplied for deposition of each mono-molecule layer, that $N_2$ gas or other inert gas is used for exchanging the gas in the reaction chamber followed by evacuation of the reaction chamber. This requires complicated changeover operation of the valves for the reaction chamber.

SUMMARY OF THE INVENTION

In view of the above, it is an object of the present invention to solve the above problems and to provide a method for forming a metal oxide film having excellent step coverage and film qualities with a higher throughput in a semiconductor device.

The present invention provides a method for forming a semiconductor device including the steps of: depositing a monoatomic film including a metal on a base by using a metal source including said metal and no oxygen; depositing a metal oxide film including oxide of said metal on said monoatomic film by using a CVD technique.

In accordance with the method of the present invention, the monoatomic film deposited on the base allows the metal oxide film depositing step to obtain a metal oxide film having excellent film properties with a higher throughput.

The above and other objects, features and advantages of the present invention will be more apparent from the following description, referring to the accompanying drawings.

PREFERRED EMBODIMENTS OF THE INVENTION

Hereinafter, the present invention will be described in detail according to preferred embodiments thereof with reference to the accompanying drawings.

First Embodiment

Figure 1A:
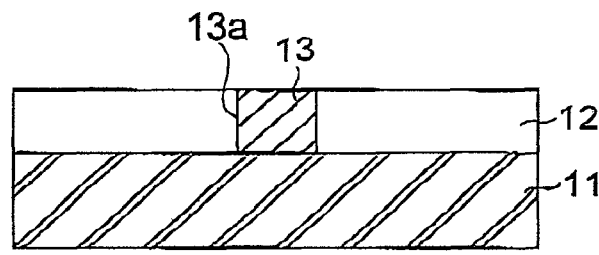
FIGS. 1A through 1C are sectional views consecutively illustrating the steps in the process for manufacturing a capacitor in accordance with the first embodiment of the present invention.
Figure 1B:
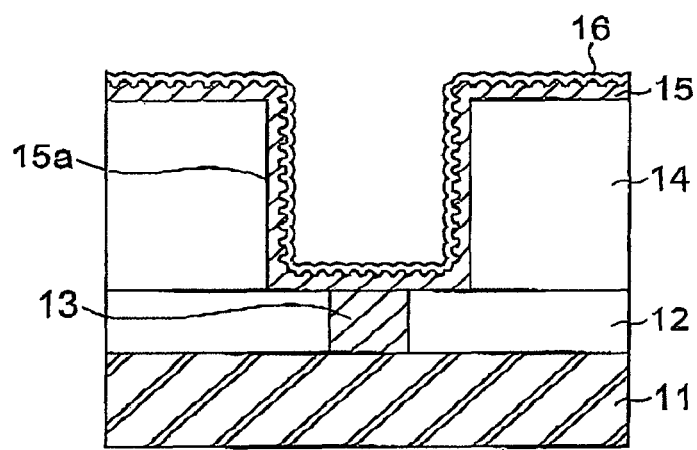
Figure 1C:
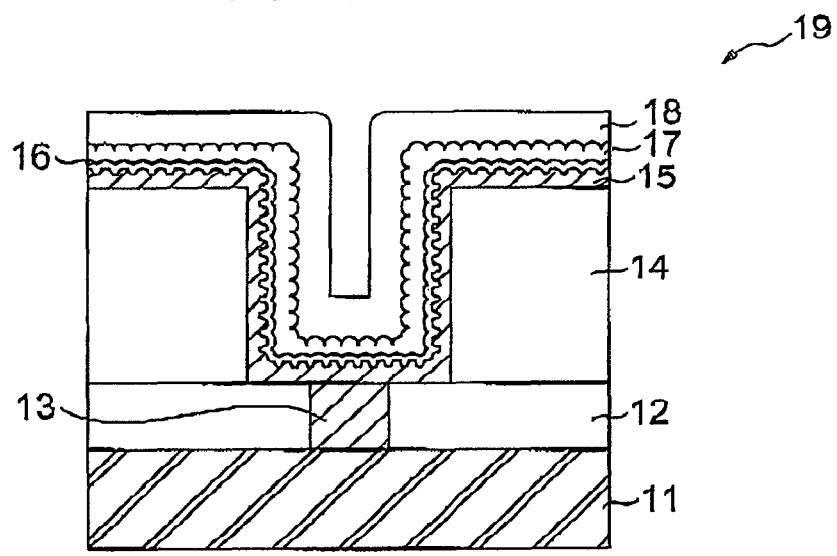

The present embodiment is an example in which the present invention is applied to a method for forming a capacitor insulation film made of tantalum oxide film. Referring to FIGS. 1A through 1C, there are shown consecutive steps of the process for fabricating the capacitor insulation film according to the present embodiment. Before forming the capacitor insulation film, an underlying film is formed on which the capacitor insulation film is to be deposited. As shown in FIG. 1A, a first interlayer insulating film 12 made of silicon oxide is formed on a silicon substrate 11. Subsequently, a through-hole 13a is formed in the first interlayer insulating film 12 to expose therein a portion of the silicon substrate 11. Thereafter, the through-hole 13a is filled with p-doped polysilicon to form a contact plug 13.

Then, as shown in FIG. 1B, a second interlayer insulating film 14 made of silicon oxide is formed on the first interlayer insulating film 12 and the contact plug 13. A cylindrical hole 15a is then formed in the second interlayer insulating film 14 to expose a portion of the first interlayer insulating film 12 encircling the contact plug 13.

A HSG (hemi-spherical grain) layer 15 made of p-doped polysilicon is then formed as a bottom electrode on the second interlayer insulating film 14, where the cylindrical hole 15a is formed. Using an RTN (rapid thermal nitration) technique, the HSG layer 15 is then nitrided to form a silicon nitride film 16 as the underlying film.

Figure 2:
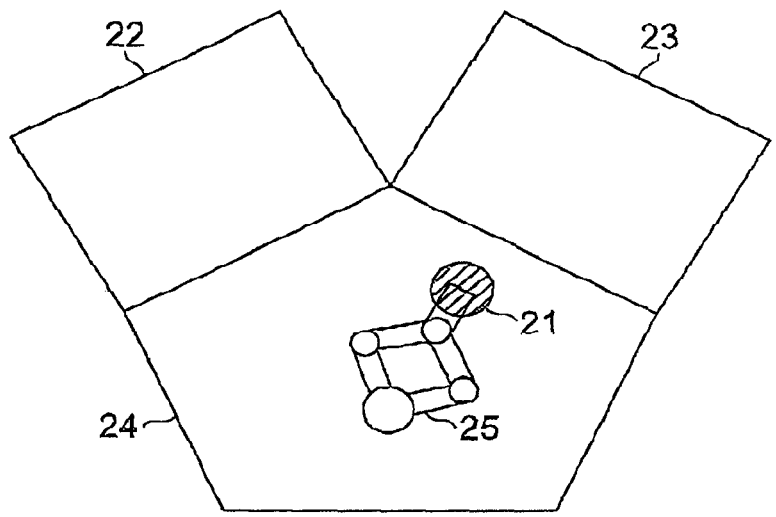
FIG. 2 is a top plan view showing chambers used to form a capacitor insulation film in accordance with the first embodiment.

The capacitor insulation film 17 is then formed thereon. FIG. 2 is a top plan view showing a deposition system for depositing the capacitor insulation film 17 on a wafer. In FIG. 2, the deposition system includes first reaction chamber 22 that is used for deposition using the ALD technique, a second reaction chamber 23 used for deposition using the CVD technique, and a transfer chamber 24 used for transferring the wafer (substrate) 21 between the first deposition chamber 22 and the second deposition chamber 23. The transfer chamber 24 has therein a robot arm 25 for carrying the wafer (substrate) 21, and is normally maintained at vacuum. Other devices are not shown in the drawing.

Figure 3:
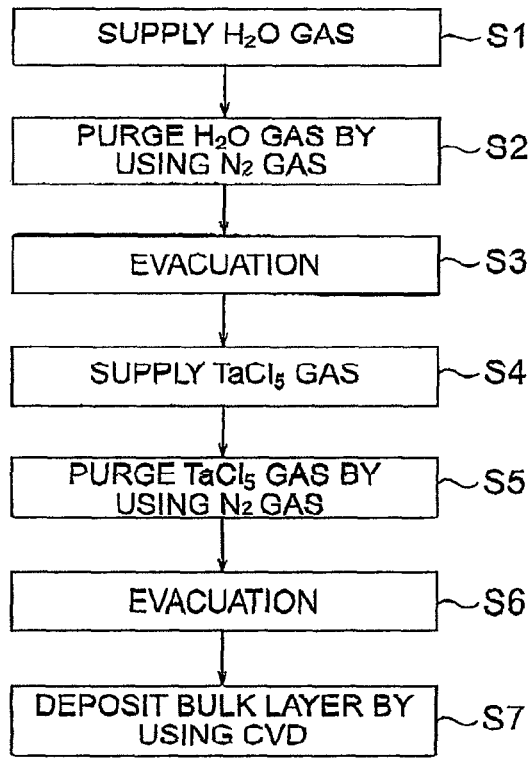
FIG. 3 is a flowchart of the procedures for fabrication of a capacitor insulation film in accordance with the first embodiment.
Figure 4A:
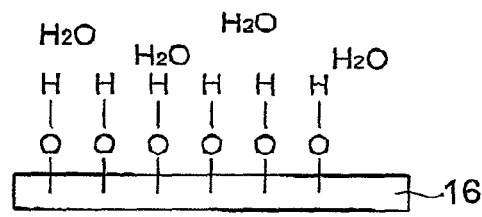
FIGS. 4A through 4D are schematic sectional views consecutively illustrating chemical reactions during forming the capacitor insulation film in accordance with the first embodiment.
Figure 4B:
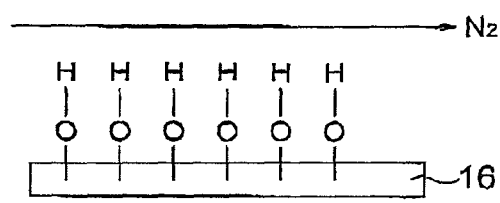

Referring to FIG. 3, there is shown a flowchart illustrating the procedures in the process for forming the capacitor insulation film in accordance with the present embodiment. FIGS. 4A to 4D show schematic sectional views of the underlying silicon nitride film 16, on which the capacitor insulation film 17 is to be formed, during the consecutive steps shown in FIG. 3. First, the wafer 21 for which the RTN process is finished is introduced into the first reaction chamber 22. The substrate temperature is maintained at 300° C., and the ambient pressure inside the first reaction chamber 22 is maintained at 400 Pa, while supplying $H_2O$ gas at a flow rate of 50 SCCM (standard cubic centimeters per minute) for 10 seconds (step S1). As shown in FIG. 4A, this causes an OH group to bind with the surface of the silicon nitride film 16. Thereafter, $N_2$ gas is supplied at a flow rate of 2 SLM (standard litters per minute) to purge unreacted $H_2O$ gas from the first reaction chamber 22, as shown in FIG. 4B (step S2). The first chamber 22 is then evacuated and maintained at vacuum for 10 seconds (step S3).

Figure 4C:
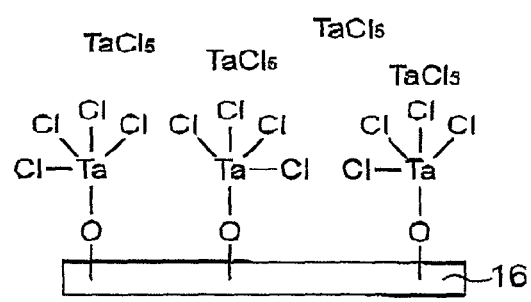
Figure 4D:
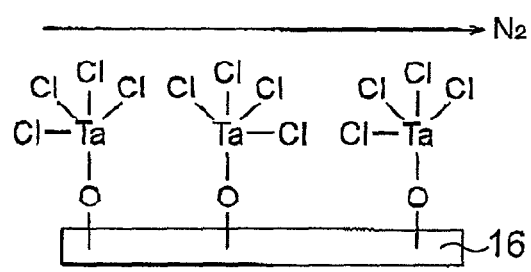

Subsequently, $TaCl_5$ gas is supplied at a flow rate of 50 SCCM into the first reaction chamber 22 for 10 seconds (step S4). As shown in FIG. 4C, this replaces the H atoms in the OH group on the surface of the silicon nitride film 16 with the $TaCl_4$ group in the $TaCl_5$ gas, thereby forming a monoatomic seed layer of $TaCl_4$ group with O atoms bound to the surface of the silicon nitride film 16. The monoatomic seed layer formed in this process exhibits a uniform film thickness and excellent film qualities, similarly to the case where the ALD technique is used to deposit the monoatomic layers. $N_2$ gas is then supplied at a flow rate of 2 SLM to purge the unreacted $TaCl_5$ gas from the first reaction chamber 22, as shown in FIG. 4D (step S5). The first chamber 22 is then evacuated and maintained at vacuum for 10 seconds (step S6).

The wafer 21 is then transferred from the first reaction chamber 22 through the transfer chamber 24 to the second reaction chamber 23, where the CVD process is conducted. The substrate temperature is maintained at 430° C. and the ambient pressure inside the second reaction chamber 23 is maintained at 400 Pa while introducing $Ta(OC_2H_5)_5$ gas at a flow rate of 200 mg/min and $O_2$ gas at a flow rate of 1.5 SLM into the second reaction chamber 23 (step S7). This step replaces the Cl atoms of the $TaCl_4$ group on the substrate surface with $O_2$ atoms to form a $TaO_2$ layer. A bulk layer of tantalum oxide is then deposited on top thereof, thereby forming the capacitor insulation film 17 made of tantalum oxide as shown in FIG. 1C.

Since the tantalum oxide film formed using the CVD technique and the seed layer are made of the same substance, a suitable deposition rate can be achieved in the deposition of the tantalum oxide film even without using a nucleus. For example, only four minutes of gas introduction achieves deposition of a 10-nm-thick tantalum oxide film. Thereafter, a TiN film 18 or the like is formed on the capacitor insulation film 17 as a top electrode, thereby achieving the overall structure of a capacitor 19.

As described above, in the method for forming the capacitor insulation film according to the present embodiment, a bulk layer of the tantalum oxide is grown on the seed layer having the same material as the bulk layer. Therefore, it is not necessary to form nuclei scattered around on the underlying film, differently from the case where the capacitor insulation film is deposited using the conventional CVD technique directly on the underlying film. In addition, the present embodiment proves a capacitor insulation film is having excellent step coverage and exhibiting excellent film qualities.

The ALD technique is used only at the stage for forming the monoatomic seed layer, followed by the CVD technique to grow the bulk layer thereon. This allows the method of the present embodiment to form the capacitor insulation film having the higher film properties with a higher degree of throughput.

In the present embodiment, step S1 through step S6 are performed in the first reaction chamber 22, and step S7 is performed in the second reaction chamber 23, as described above. However, in cases where the film deposition temperatures (the substrate temperatures) are only slightly different between in step S1 through step S6 and in step S7, it is also possible to perform the operations of step S1 through step S7 continuously in one of the reaction chambers 22 and 23. For example, if the difference in temperature is 40° C. or less, then it is considered that the temperature in the chamber can be changed in a short period of time. Therefore, a high level of throughput can be maintained even when the steps are performed continuously in one of the chambers.

Figure 5:
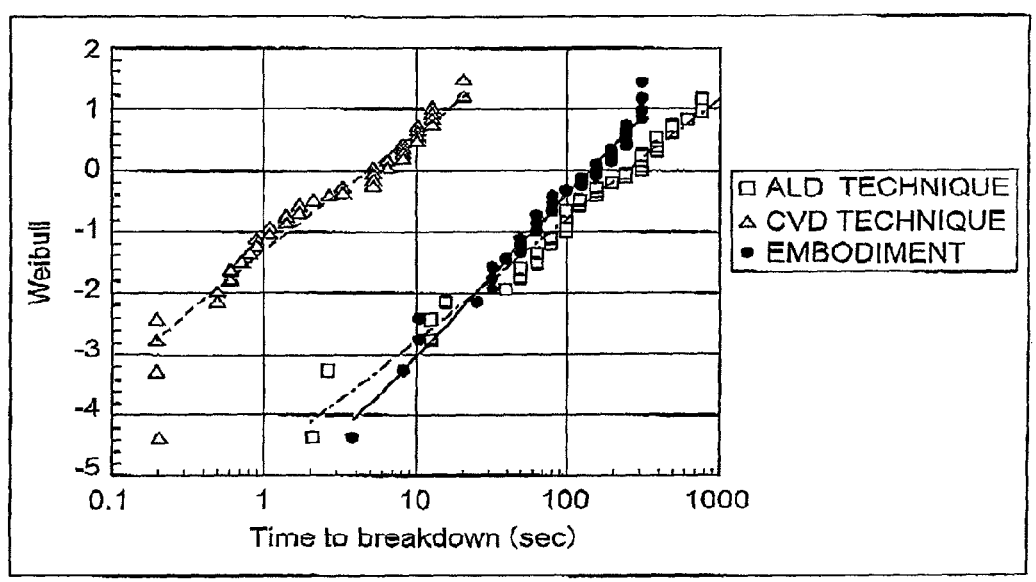
FIG. 5 is a graph showing results of TDDB (time dependent dielectric breakdown) tests performed on capacitor insulation films formed in accordance with the first embodiment and the conventional technique.

Referring to FIG. 5, there is shown graphs illustrating results of TDDB (time dependent dielectric breakdown) tests performed on the capacitor insulation film made of tantalum oxide films formed using the CVD technique, the ALD technique and the method of the present embodiment, which are used to form respective capacitor insulation films of the same thickness. In FIG. 5, the ordinate represents Weibull distribution, and the abscissa represents the time (seconds) when the dielectric breakdown occurs. The dielectric breakdown times of 40 samples (shown at dots) are arranged in sequence of their Weibull distributions for each of the techniques used. The tests were performed for all of the samples having capacitor insulation film of 10-nm thickness, under the conditions with ambient temperature of 85° C., and with 4.6 V of stress voltage on the capacitor insulation film.

In FIG. 5, the capacitor insulation films formed using the method of the present embodiment had significantly improved insulation properties compared with the capacitor insulation films formed using the CVD technique, and had excellent insulation properties substantially similar to those of the capacitor insulation films formed using the ALD technique.

In the ALD technique, it is desired to reduce the time length for the cycle of growing a single mono-atomic layer, in order to decrease the time length for depositing the overall capacitor insulation film. However, in the present embodiment, since the time length required for forming the bulk layer of the capacitor insulation film is not long, there is an advantage that a sufficient time length can be taken for the formation of the seed layer having excellent properties. By forming the balk layer on top of the excellent seed layer, an excellent capacitor insulation film can be obtained.

Second Embodiment

The present embodiment is an example in which the present invention is again applied to the formation of a capacitor insulation film made of tantalum oxide film. The present embodiment is similar to the first embodiment described above, except that step S1 of the first embodiment is performed in the ambience of active oxygen gas supplied instead of the $H_2O$ gas in the reaction chamber.

In the present embodiment, the supply of the active oxygen gas in step S1 causes oxygen to bind to the surface of the silicon nitride film 16 through oxidation. Then, the provision of the $TaCl_5$ gas in step S4 causes the oxygen, that is bound to the surface of the silicon nitride film 16, to bind with the $TaCl_4$ group in the $TaCl_5$ gas, thereby forming a seed monatomic layer made of $TaCl_4$ group bound to the O atoms on the surface of the silicon nitride film 16. Therefore, in the present embodiment, as in the first embodiment, the bulk layer made of the tantalum oxide film is suitably grown on top of the seed layer, which is made of the same material. Therefore, similar effects can be obtained as in the first embodiment without the need of forming nuclei scattered across the underlying film.

Third Embodiment

Figure 6:
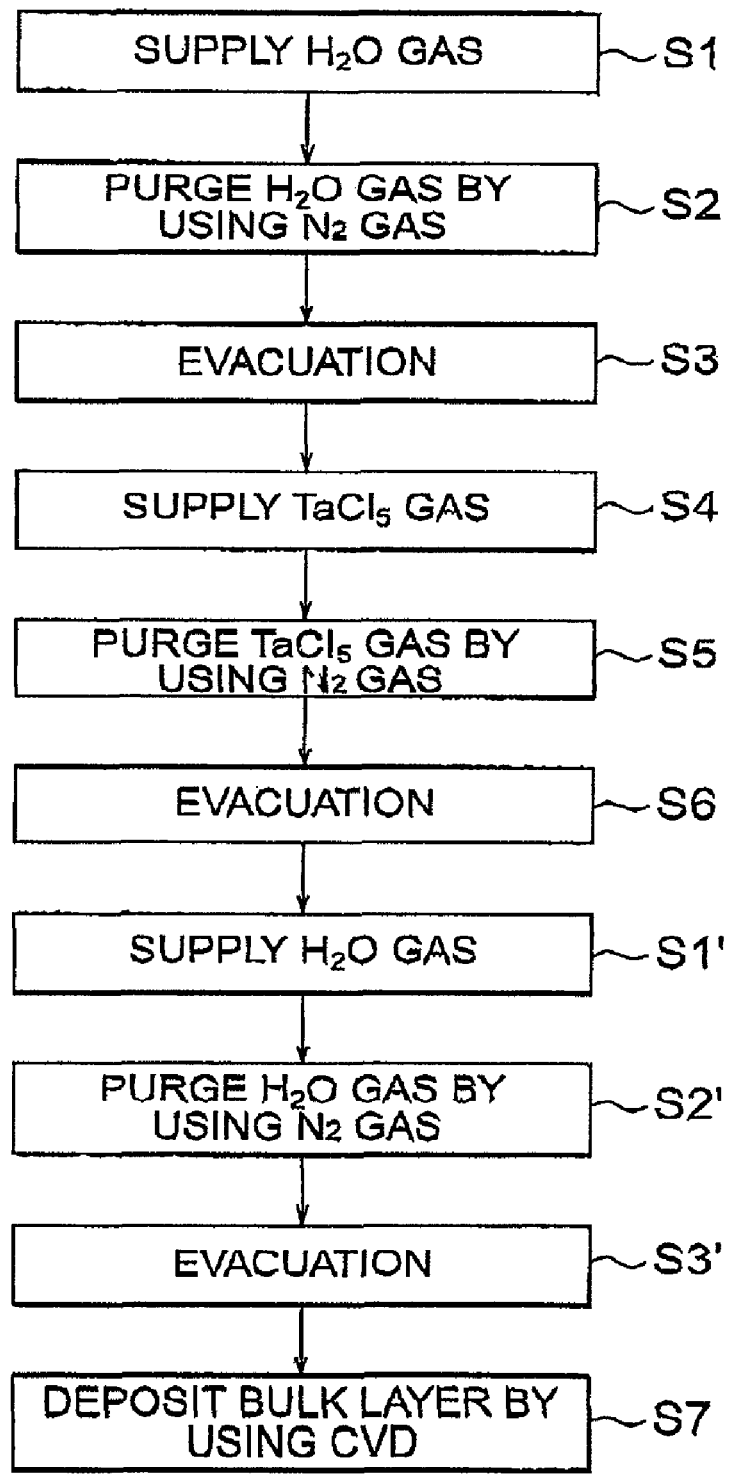
FIG. 6 is a flowchart showing the procedures in a process for fabrication of a capacitor insulation film in accordance with a second embodiment of the present invention.
Figure 7:
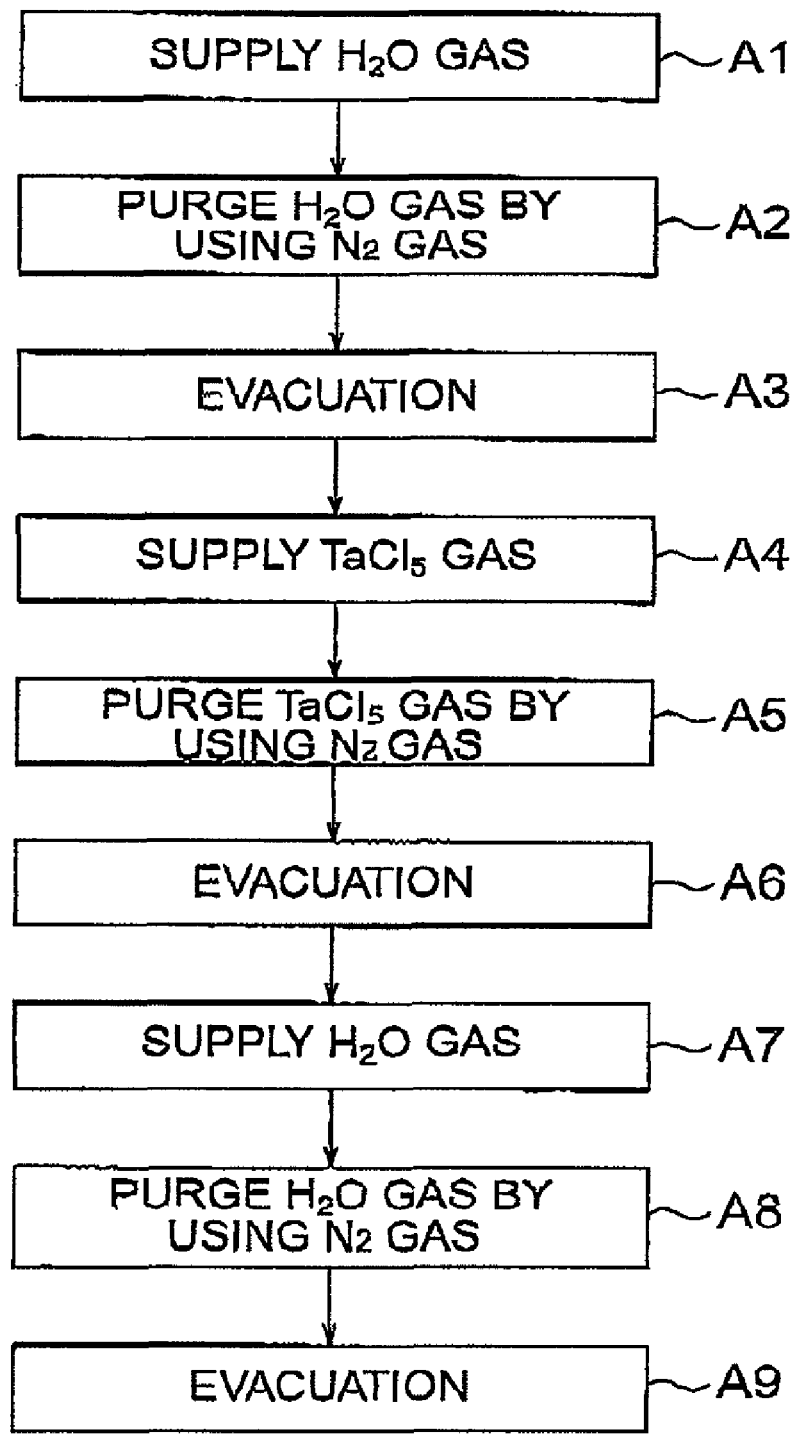
FIG. 7 is a flowchart showing the procedures in a process for fabrication of a capacitor insulation film using the ALD technique.

The present embodiment is an example in which the present invention is again applied to the formation of a capacitor insulation film made of tantalum oxide film. FIG. 6 shows the procedures of the present embodiment. The present embodiment is similar to the first embodiment except that step S1'-step S3' similar to step S1-step S3 in the first embodiment are iterated in the present embodiment.

More specifically, in step S1' of the present embodiment, $H_2O$ gas is supplied after step S6 under the conditions similar to step S1. As a result, the Cl atoms in the $TaCl_4$ group are replaced with OH atoms (step S1'). Then, $N_2$ gas is supplied under the conditions similar to step S2 so as to purge the remaining $H_2O$ gas and the Cl atoms (or HCl gas), that were replaced at step S1', from the first reaction chamber 22 (step S2'). Then, the chamber is evacuated to vacuum under the conditions similar to step S3 (step S3').

In accordance with the present embodiment, step S1'-step S3' are performed after step S6, whereby, the Cl atoms which are bound to the Ta atoms are replaced by the OH group in step S1', the Cl atoms (HCl gas) replaced are removed from the first reaction chamber 22 in step S2' and step S3', and then the process advances to step S7. Therefore, impurities formed by the Cl atoms can be prevented from contaminating the capacitor insulation film, and the resultant capacitor insulation film has excellent film qualities.

In the examples of the first through third embodiments, $TaCl_5$ is used as the metal source therefor. However, It is also possible to use $TaF_5$, $Ta(N(C_2H_5)_2)_3$ or the like as the metal source. Furthermore, by using Al, Ti, Hf, or Nb metal alloys as the metal source, it is also possible to form a metal oxide film made of aluminum oxide, titanium oxide, hafnium oxide, or niobium oxide. For example, by using $Al(CH_3)_3$ as the metal source, it is possible to form aluminum oxide. By using $TiCl_4$ or $Ti(N(CH_3)_2)_4$ as the metal source, it is possible to form titanium oxide. By using $Hf(N(CH_3)_2)_4$, $Hf(N(C_2H_5)(CH_3))_4$, or $Hf(N(C_2H_5)_2)_4$ as the metal source, it is possible to form hafnium oxide. By using $NbCl_5$, $NbF_5$, or $Nb(N(C_2H_5)_2)_3$ as the metal source, it is possible to form niobium oxide.

In the first through third embodiments, $H_2O$ gas, or active oxygen gas are used as the oxidizing gas. It is also possible to use $O_2$, ozone, or $N_2O$ as the oxidizing gas. Alternatively, hydrofluoric acid may also be used to perform hydrofluoric acid processing. Furthermore, in the first through third embodiments, the metal oxide film is formed on the silicon nitride film, which is formed using the RTN technique. However, a similar method may also be used as in the embodiments to form the metal oxide film on top of a silicon substrate, a polysilicon film, or a metallic film, for example.

Since the above embodiments are described only for examples, the present invention is not limited to the above embodiments and various modifications or alterations can be easily made therefrom by those skilled in the art without departing from the scope of the present invention.

What is claimed is:

1. A method for forming a capacitor insulation film in a semiconductor device, the method comprising the steps of:
   supplying material gas which provides OH base on an underlying film;
   depositing a monoatomic film by supplying a metal source including compound gas using an atomic layer deposition technique; and
   forming a metal oxide film by supplying metal organic compound gas and oxidizing gas using a chemical vapor deposition technique;
   wherein the monoatomic film and the metal oxide film comprise the same metal and the steps are performed in sequence without reverting to a prior step.

2. The method of claim 1, wherein said material gas includes $H_2O$.

3. The method of claim 1, wherein said material gas includes heated $H_2O$.

4. The method of claim 1, wherein said metal source including compound gas includes at least one compound selected from the group consisting of $TaCl_5$, $TaF_5$, and $Ta(N(C_2H_5)_2)_3$, and said metal oxide film includes $TaO_5$.

5. The method of claim 1, wherein said metal source including compound gas includes at least one compound selected from the group consisting of $Hf(NCH_3)_2)_4$, $Hf(N(C_2H_5)(CH_3))_4$, and $Hf(C_2H_5)_2)_4$, and said metal oxide film includes hafnium oxide.

6. The method of claim 1, wherein said metal source including compound gas includes at least one compound selected from the group consisting of $NbCl_5$, $NbF_5$, and $Nb(N(C_2H_5)_2)_3$, and said metal oxide film includes niobium oxide.

7. The method of claim 1, wherein said metal source including compound gas includes $Al(CH_3)_3$, and said metal oxide film includes aluminum oxide.

8. The method of claim 1, wherein said metal source including compound gas includes $TiCl_4$ or $Ti(N(CH_3)_2)_4$, and said metal oxide film includes titanium oxide.

9. The method of claim 1, wherein said metal organic compound gas includes $Ta(OC_2H_5)_5$.

10. The method of claim 1, wherein said oxidizing gas includes at least one gas selected from the group consisting of $O_2$, active oxygen, ozone and $N_2O$.

11. The method of claim 1, wherein said underlying film is either silicon substrate, polysilicon film, silicon nitride film or metallic film.

12. The method of claim 1, further comprising the step of supplying oxidizing gas onto a surface of said monoatomic film, between said depositing a monoatomic film step and said forming a metal oxide film step.

13. The method of claim 12, wherein said oxidizing gas includes at least one gas selected from the group consisting of $O_2$, active oxygen, ozone, and $N_2O$.

14. The method of claim 1, further comprising the step of forming a conductive film on said metal oxide film, wherein said steps are used for forming a capacitor including said underlying film as a bottom electrode, said metal oxide film as a capacitor insulation film, and said conductive film as a top electrode.

15. A method for forming a capacitor insulation film in a semiconductor device, the method comprising the steps of:

(a) supplying material gas which provides OH base on a surface of a bottom electrode of the capacitor;

(b) forming a monoatomic film including a metal on the bottom electrode by using an atomic layer deposition technique which supplies a compound including the metal and does not supply oxygen as a source gas; and (c) forming a metal oxide film on the monoatomic film by supplying metal compound gas and oxidizing gas using a chemical vapor deposition technique, wherein the monoatomic film and the metal oxide film comprise the same metal.

16. The method of claim 15, wherein the metal is titanium.

17. The method of claim 16, wherein the source gas for forming the monoatomic film is $TiCl_4$ or $Ti(N(CH_3)_2)_4$.

18. The method of claim 17, wherein the oxidizing gas includes at least one gas selected from the group consisting of $O_2$, active oxygen, ozone and $N_2O$.

* * * * *